United States Patent
Jenq et al.

(10) Patent No.: US 12,224,183 B2
(45) Date of Patent: Feb. 11, 2025

(54) METHOD OF MANUFACTURING SEMICONDUCTOR DEVICE

(71) Applicant: CHIPBOND TECHNOLOGY CORPORATION, Hsinchu (TW)

(72) Inventors: Shrane-Ning Jenq, Hsinchu County (TW); Wen-Cheng Hsu, Hsinchu County (TW); Chen-Yu Wang, Hsinchu (TW); Chih-Ming Kuo, Hsinchu County (TW); Chwan-Tyaw Chen, Hsinchu (TW); Lung-Hua Ho, Hsinchu (TW)

(73) Assignee: CHIPBOND TECHNOLOGY CORPORATION, Hsinchu (TW)

(*) Notice: Subject to any disclaimer, the term of this patent is extended or adjusted under 35 U.S.C. 154(b) by 419 days.

(21) Appl. No.: 17/896,171

(22) Filed: Aug. 26, 2022

(65) Prior Publication Data
US 2023/0135424 A1 May 4, 2023

(51) Int. Cl.
*H01L 21/48* (2006.01)
*C23C 18/54* (2006.01)
(Continued)

(52) U.S. Cl.
CPC .......... *H01L 21/4857* (2013.01); *C23C 18/54* (2013.01); *C23C 28/02* (2013.01);
(Continued)

(58) Field of Classification Search
CPC ......... H01L 21/31138; H01L 21/32136; H01L 21/4853; H01L 21/4857; H01L 21/486; H01L 21/561; H01L 23/3114; H01L 23/49811; H01L 23/49816; H01L 23/49838; H01L 23/49866; H01L 23/5383; H01L 23/5384; H01L 23/5389;
(Continued)

(56) References Cited

U.S. PATENT DOCUMENTS

| 9,425,178 B2 | 8/2016 | Lin et al. |
| 10,833,002 B2 | 11/2020 | Kim |
| 2005/0122698 A1* | 6/2005 | Ho ............ H05K 1/185 361/764 |

(Continued)

FOREIGN PATENT DOCUMENTS

| JP | 2003-158239 A | 5/2003 |
| JP | 2011-134960 A | 7/2011 |

(Continued)

OTHER PUBLICATIONS

Taiwanese Office Action mailed Apr. 22, 2022 for Taiwanese Patent Application No. 110140682, 5 pages.
(Continued)

*Primary Examiner* — Brook Kebede
(74) *Attorney, Agent, or Firm* — Demian K. Jackson; Jackson IPG PLLC

(57) ABSTRACT

A package including a first carrier, a seed layer, wires, a die and a molding material is provided. The first carrier is removed to expose the seed layer after disposing a second carrier on the molding material, then the seed layer is removed to expose the wires, and a gold layer is deposited on each of the wires by immersion gold plating, finally a semiconductor device is obtained. The gold layer is provided to protect the wires from oxidation and improve solder joint reliability.

18 Claims, 7 Drawing Sheets

(51) Int. Cl.
  *C23C 28/02*       (2006.01)
  *C25D 7/12*        (2006.01)
  *H01L 21/311*      (2006.01)
  *H01L 21/3213*     (2006.01)
  *H01L 23/498*      (2006.01)
  *H01L 23/00*       (2006.01)

(52) U.S. Cl.
  CPC ........ *C25D 7/123* (2013.01); *H01L 21/31138* (2013.01); *H01L 21/32136* (2013.01); *H01L 21/486* (2013.01); *H01L 23/49811* (2013.01); *H01L 23/49816* (2013.01); *H01L 23/49838* (2013.01); *H01L 23/49866* (2013.01); *H01L 24/16* (2013.01); *H01L 2224/16225* (2013.01)

(58) Field of Classification Search
  CPC ......... H01L 24/14; H01L 24/19; H01L 24/20; H01L 24/46; H01L 24/96; H01L 24/97; H01L 25/0655; H01L 25/0652; H01L 25/18; H01L 25/50; C23C 18/54; C23C 28/02; C25D 7/123
  See application file for complete search history.

(56) References Cited

U.S. PATENT DOCUMENTS

| | | |
|---|---|---|
| 2012/0119358 A1 | 5/2012 | Oh |
| 2016/0013172 A1 | 1/2016 | Lin et al. |
| 2019/0295912 A1* | 9/2019 | Yu .......................... H01L 25/18 |

FOREIGN PATENT DOCUMENTS

| | | |
|---|---|---|
| JP | 2014-27097 A | 2/2014 |
| JP | 2015-216344 A | 12/2015 |
| JP | 2017-76790 A | 4/2017 |
| TW | 201917855 A | 5/2019 |
| TW | 202038405 A | 10/2020 |
| WO | 2011/027884 A1 | 3/2011 |

OTHER PUBLICATIONS

1 Korean Office Action mailed Jun. 10, 2024 for Korean Patent Application No. 10-2022-0106017, 6 pages.
Japanese Office Action mailed Sep. 20, 2023 for Japanese Patent Application No. 2022-132672, 7 pages.

* cited by examiner

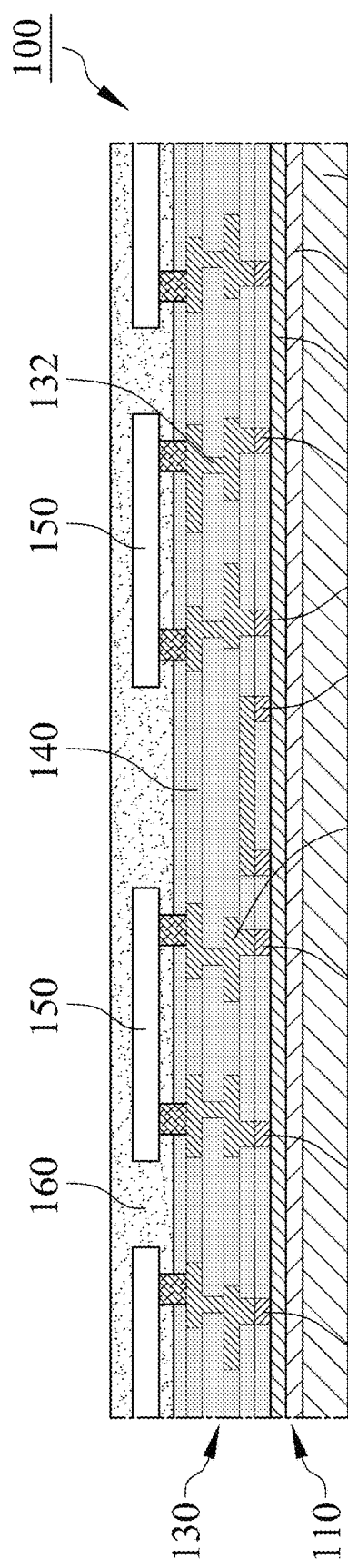
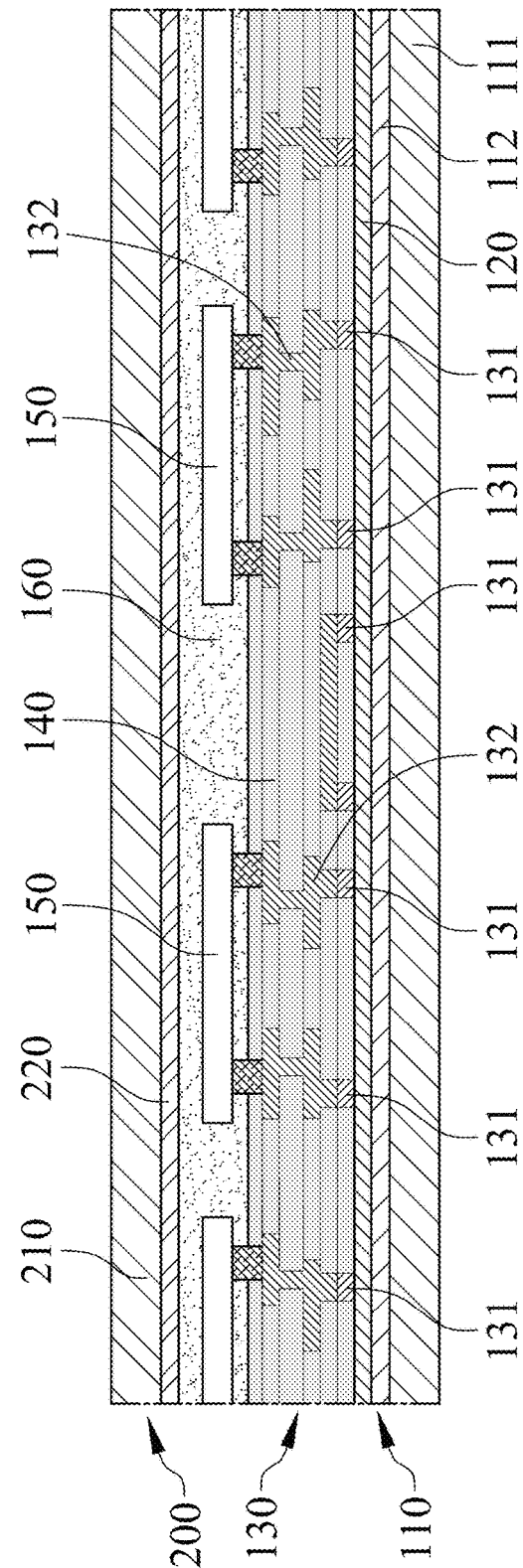
FIG. 1
FIG. 2

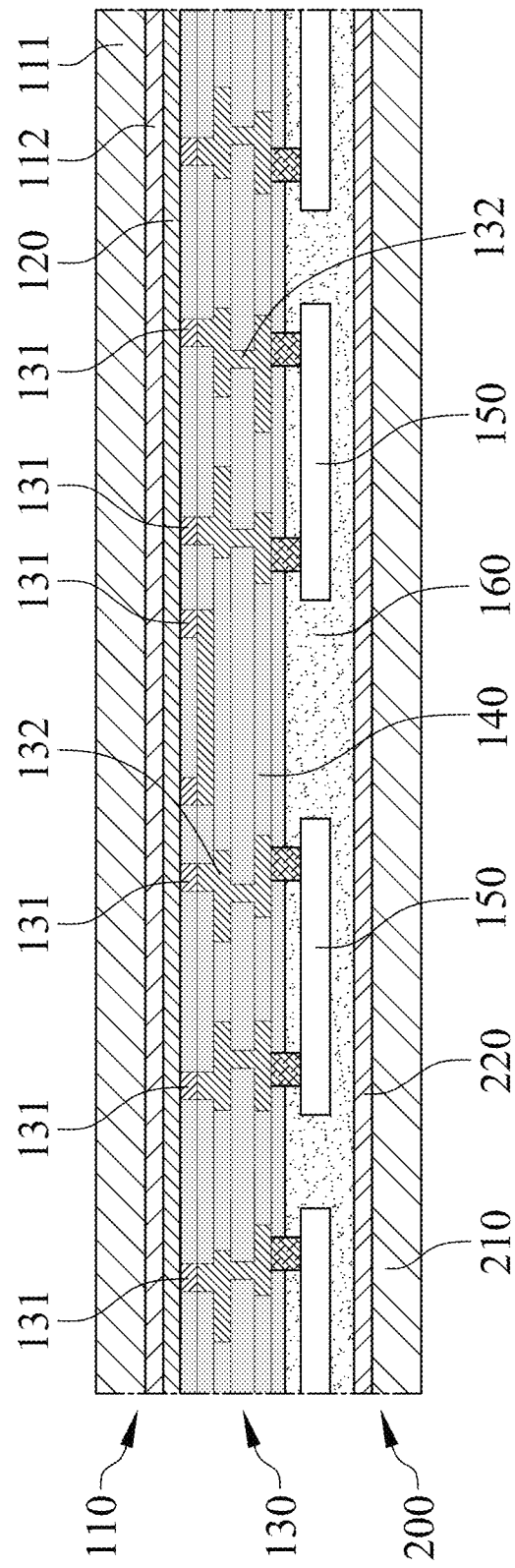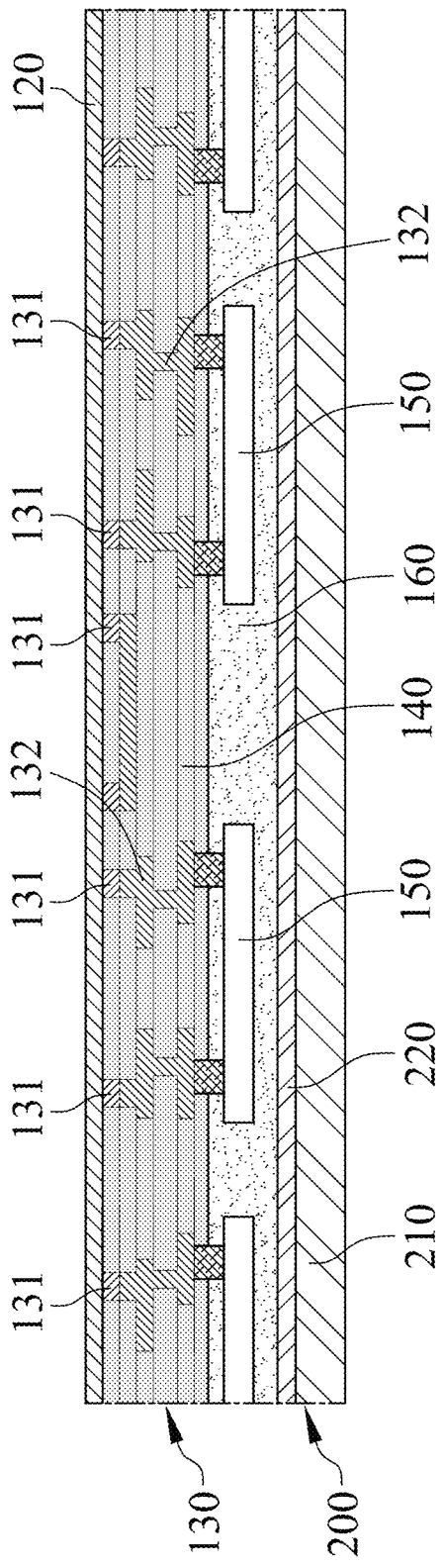

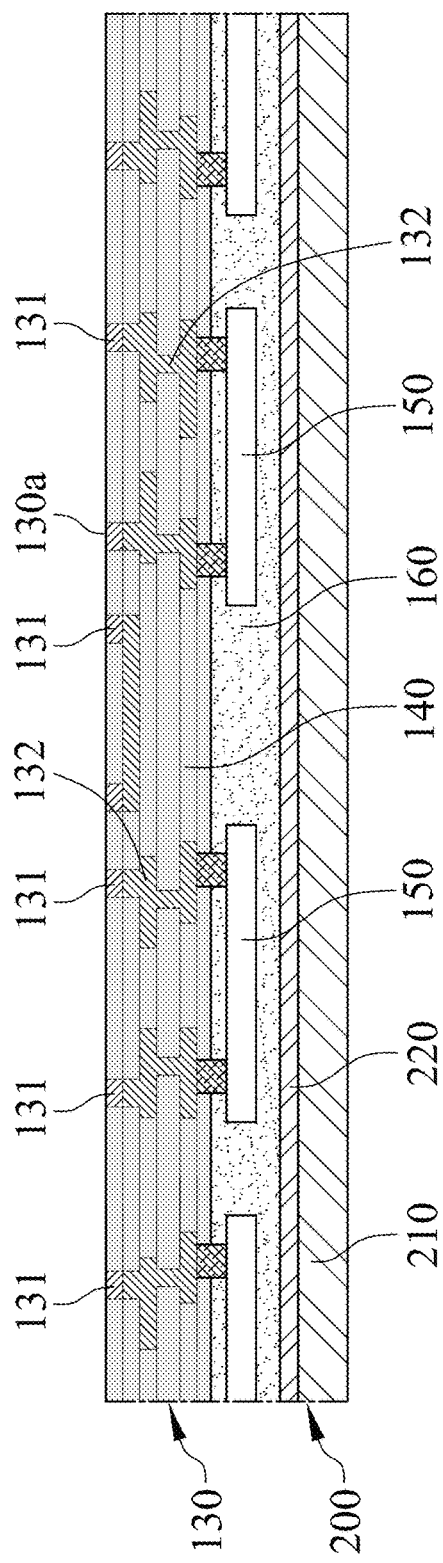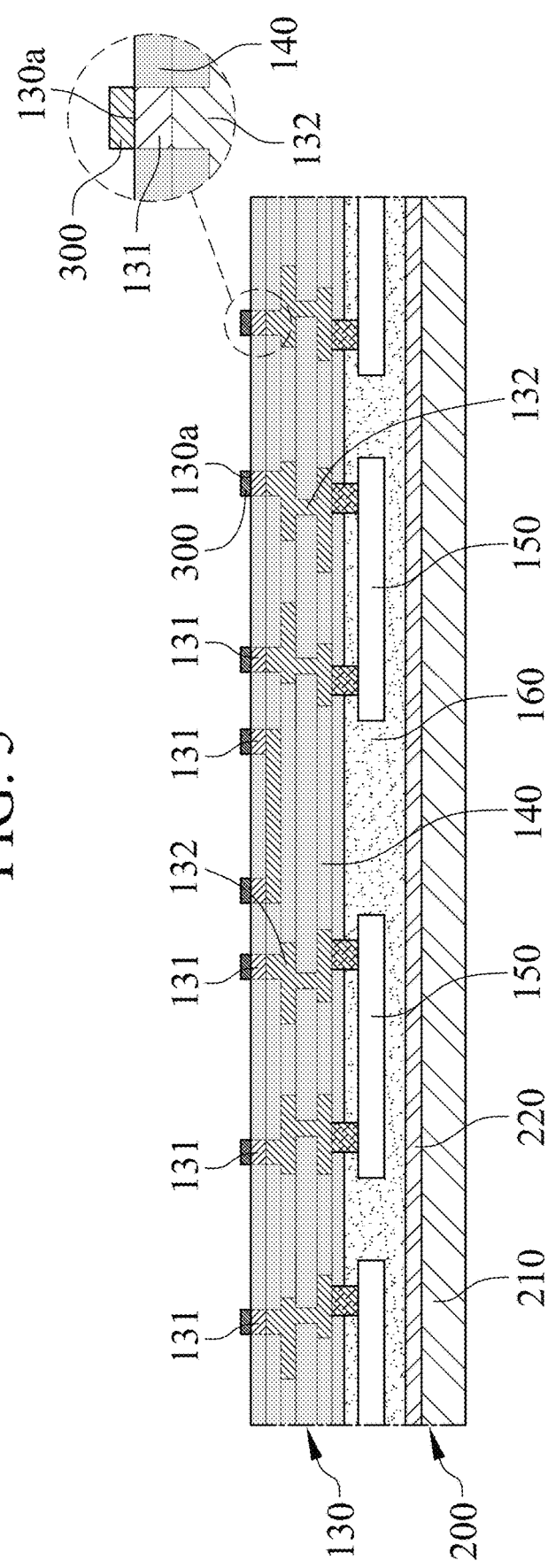

METHOD OF MANUFACTURING SEMICONDUCTOR DEVICE

FIELD OF THE INVENTION

This invention relates to a method of manufacturing a semiconductor device, and more particularly to a method of manufacturing a semiconductor device with improvement of solder joint reliability.

BACKGROUND OF THE INVENTION

In order to protect wires from oxidation, a surface treatment layer is usually provided on wires to isolate air surrounding the wires. Conventionally, the surface treatment layer is generated by electroless nickel immersion gold (ENIG) or electroless nickel electroless palladium immersion gold (ENEPIG) process. In ENIG process, nickel ions are reduced to metallic nickel by a reducing agent and the metallic nickel is deposited on copper wires to form a nickel layer, and then gold is deposited on the nickel layer by a displacement reaction, however, hydrogen bubble generated during nickel deposition may cause a problem of air pore. In ENEPIG process, metallic copper on surface of the wires is replaced by metallic palladium by chemical reaction, a nickel-phosphorus alloy layer is formed by electroless plating based on palladium core, and gold is deposited on the nickel-phosphorus alloy layer by displacement reaction. There is also a problem of air pore in the nickel layer after ENEPIG process, and the nickel-phosphorus alloy layer is usually over-etched during immersion gold plating to lower solder joint reliability.

SUMMARY

One object of the present invention is to provide a method of manufacturing a semiconductor device. A gold layer is coated on wires of package to protect the wires from oxidation and improve solder joint reliability.

A method of manufacturing a semiconductor device disclosed in the present invention includes the steps as follows. Firstly, a package including a first carrier, a seed layer, wires, a die and a molding material is provided, the seed layer is formed on the first carrier, the wires are formed on the seed layer, the die is bonded to the wires, the molding material is adapted to cover the die and the wires. Next, a second carrier is disposed on the molding material, the first carrier is removed to expose the seed layer, and the seed layer is removed to expose the wires. Finally, a gold layer is deposited on each of the wires by immersion gold plating.

DESCRIPTION OF THE DRAWINGS

FIG. 1 is a cross-section view diagram illustrating a package in accordance with a first embodiment of the present invention.

FIGS. 2 to 7 are cross-section view diagrams illustrating a method of manufacturing a semiconductor device in accordance with a first embodiment of the present invention.

DETAILED DESCRIPTION OF THE INVENTION

Figure 7:
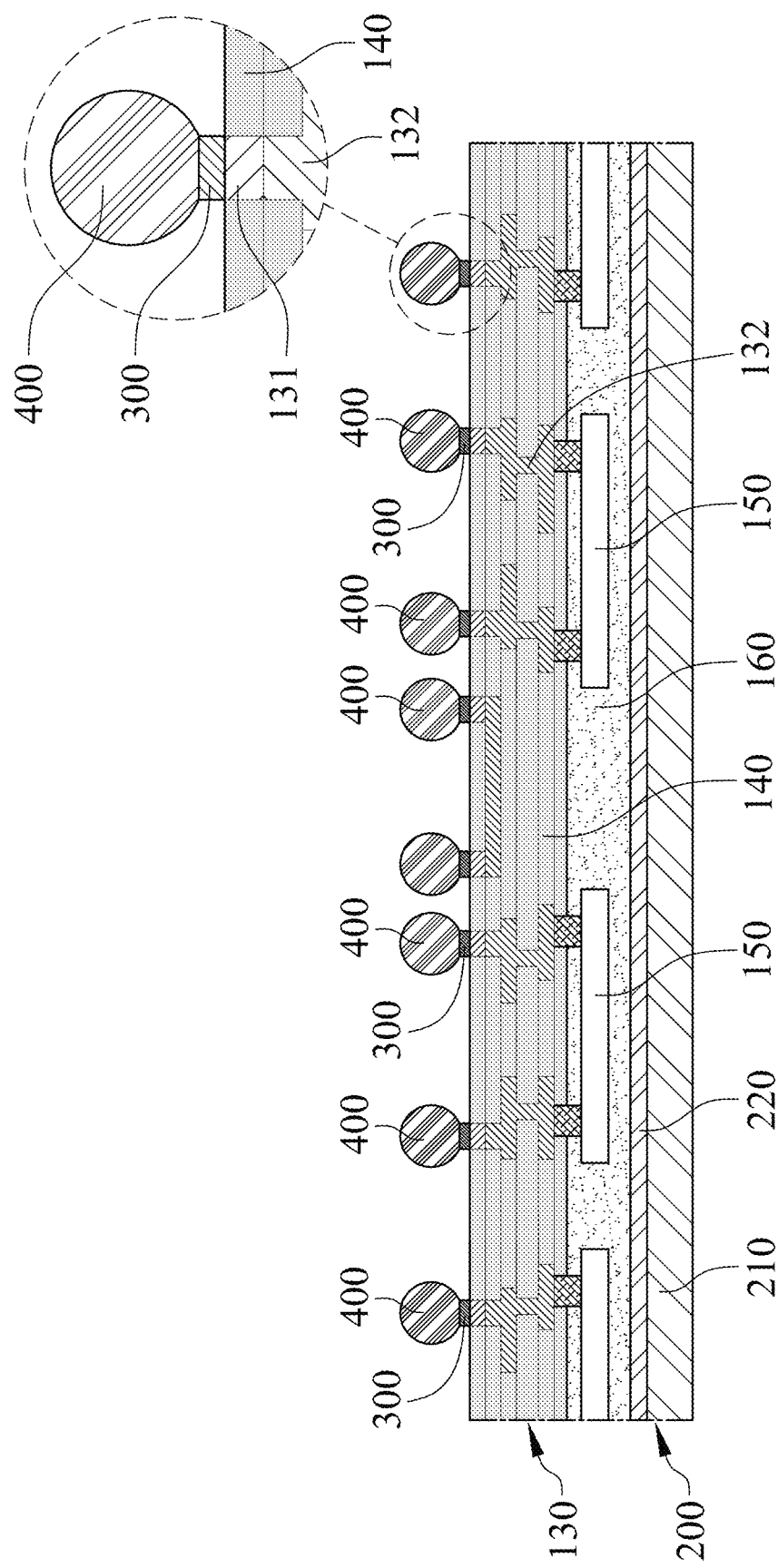

With reference to FIG. 1, a package 100 is provided firstly in a method of manufacturing a semiconductor device of the present invention. The package 100 includes a first carrier 110 and a seed layer 120 which is formed on the first carrier 110. Preferably, the first carrier 110 includes a first substrate 111 and a first release layer 112, the first release layer 112 is formed on the surface of the first substrate 111, and the seed layer 120 is formed on the first release layer 112. The first substrate 111 may be a glass substrate, a silicon wafer or ceramic substrate, and the material of the first release layer 112 may be polyimide (PI) or inorganic release agent such as halogen-metal compound. The seed layer 120 may be a titanium-tungsten/copper (TiW/Cu) layer or a titanium/copper (Ti/Cu) layer, and preferably, the seed layer 120 is coated on the first release layer 112 by sputtering.

Referring to FIG. 1 again, the package 100 further includes a plurality of wires 130, at least one die 150 and a molding material 160. The wires 130 are formed on the seed layer 120, the die 150 is bonded to the wires 130, and the molding material 160 covers the die 150 and the wires 130. Preferably, the die 150 is bonded to the wires 130 through conventional flip-chip bonding technique, and the wires 130 are formed on the seed layer 120 using a patterned dielectric layer 140. A dielectric layer is formed on the seed layer 120 and then etched to generate a plurality of openings which expose the seed layer 120, and the wires 130 are formed in the openings. The material of the dielectric layer is polyimide, benzocyclobutene (BCB) or epoxy, and in this embodiment, the dielectric layer is made of polyimide.

In the first embodiment of the present invention, each of the wires 130 includes a nickel (Ni) layer 131 and a copper (Cu) layer 132. The nickel layer 131 is formed on the seed layer 120 by pure nickel electroplating and is made of pure nickel without phosphorus (P), thus there is no issue of air pore-generation and phosphorus deposition in the nickel layer 131, the porosity of the electroplated nickel layer 131 is lower than that of the electroless plated nickel layer, and the density of the electroplated nickel layer 131 is greater than that of the electroless plated nickel layer. The copper layer 132 is preferably a redistribution layer (RDL) formed on the nickel layer 131.

With reference to FIG. 2, next, a carrier 200 is positioned on the molding material 160. Preferably, the second carrier 200 includes a second substrate 210 and a second release layer 220, the second substrate 210 is made of glass, silicon wafer, ceramic, stainless steel or silicon glue with glass fibers, and the second release layer 220 is made of pressure sensitive adhesive (PSA), epoxy or silicon glue. The first substrate 111 and the second substrate 210 can be made of the same or different materials.

With reference to FIG. 3, after positioning the second carrier 200 on the molding material 160, the semiconductor device is turned upside down to allow the first carrier 110 to be located on the top of the semiconductor device and allow the second carrier 200 to be located on the bottom of the semiconductor device. Referring to FIG. 4, then, the first carrier 110 is removed to show the seed layer 120 located under the first carrier 110. In the first embodiment, the first release layer 112 is separated from the seed layer 120 by mechanical debonding so as to remove the first substrate 111 and the first release layer 112 together.

With reference to FIG. 5, the seed layer 120 is removed to show the wires 130 after removing the first carrier 110. Preferably, the seed layer 120 is removed by etching to expose a top surface 130*a* of each of the wires 130. In the first embodiment, the seed layer 120 is removed by plasma etching to allow the nickel layer 131 of each of the wires 130 to be visible.

With reference to FIG. 6, after removing the seed layer 120, a gold layer 300 is deposited on each of the wires 130 by immersion gold plating. The gold layer 300 is a surface treatment layer or passivation layer used to protect the wires 130 from oxidation. Compared to electroplated gold layer, the immersion plated gold layer 300 has better thickness uniformity and coverage. A thinner gold layer 300 formed by immersion gold plating has similar effect on anti-oxidation defense as a thicker electroplated gold layer, so the gold layer 300 formed by immersion gold plating has benefit in reducing cost.

In the first embodiment, the nickel layer 131 of each of the wires 130 is visible after removing the seed layer 120, and then the gold layer 300 is deposited on the nickel layer 131 by immersion gold plating. Owing to the nickel layer 131 formed by pure nickel electroplating has no phosphorus and has high density, the nickel layer 131 will not be over-etched or generate black pads during the deposition of the gold layer 300. As a result, the gold layer 300 has a better anti-oxidation defense effect to improve solder joint reliability significantly.

Referring to FIG. 7, if the semiconductor device is designed as a ball grid array (BGA), a solder ball 400 is disposed on the gold layer 300 after the deposition of the gold layer 300, and then the conventional following processes, such as removing the second carrier 200, cutting and EMI shielding, are proceeded to obtain a BGA. On the other hand, if the semiconductor device is designed as a land grid array (LGA), no solder ball is required to be disposed on the gold layer 300, a LGA can be obtained after the conventional following processes as above-mentioned.

Figure 8:
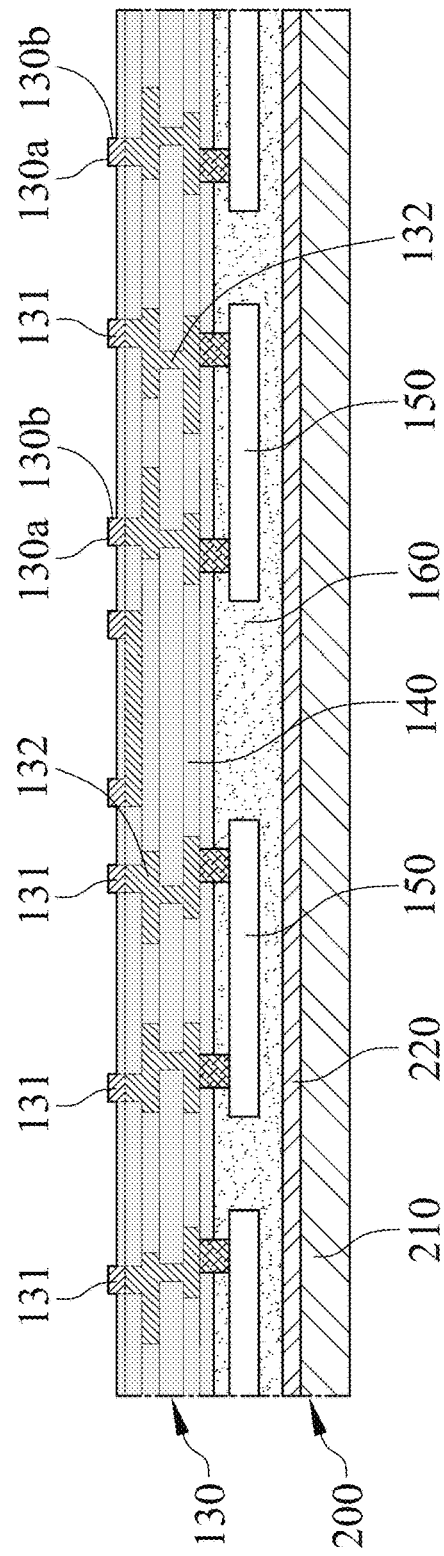
FIGS. 8 and 9 are cross-section view diagrams illustrating a method of manufacturing a semiconductor device in accordance with a second embodiment of the present invention.
Figure 9:
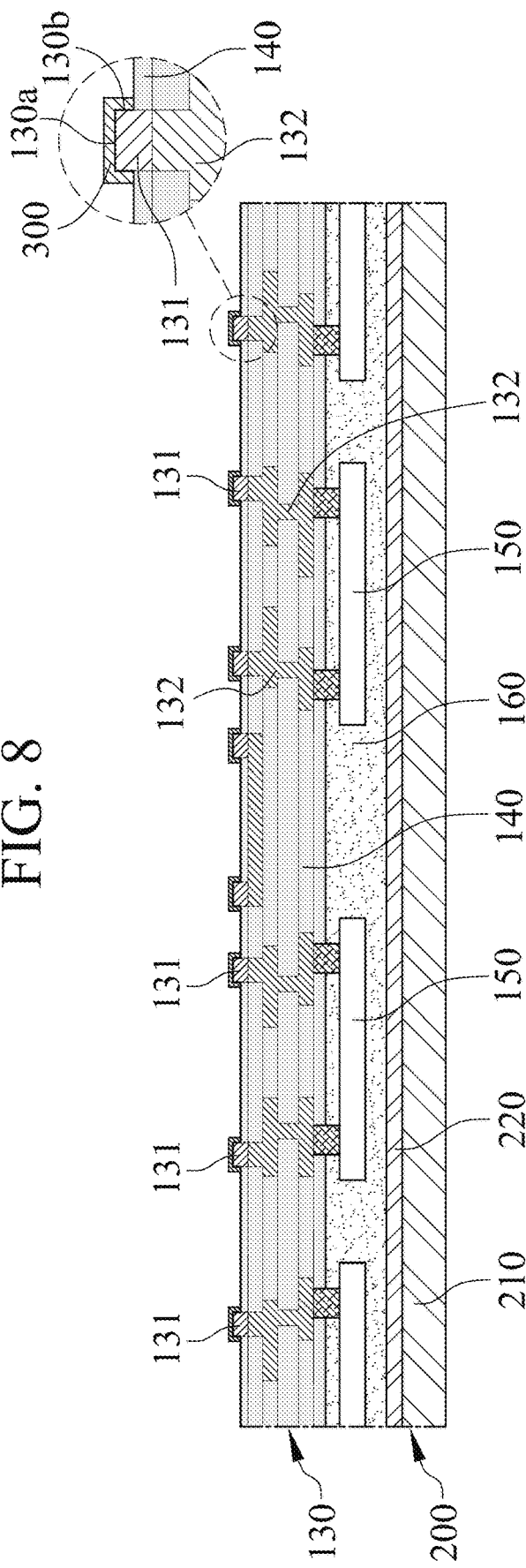

A second embodiment of the present invention is shown in FIGS. 8 and 9. As removing the seed layer 120, plasma etching parameters can be adjusted to remove a top part of the patterned dielectric layer 140 together with the seed layer 120, such that a top surface 130*a* and a lateral surface 130*b* of each of the wires 130 are visible after plasma etching. Thus, the gold layer 300 can be deposited on the top surface 130*a* and the lateral surface 130*b* of each of the wires 130 by immersion gold plating. The coverage area of the gold layer 300 on each of the wires 130 is increased to improve solder joint reliability. In the second embodiment, the top surface 130*a* and the lateral surface 130*b* of each of the wires 130, which are exposed after removing the seed layer 120 and a part of the patterned dielectric layer 140 by plasma etching, are the top surface and the lateral surface of the nickel layer 131 of each of the wires 130, and the gold layer 300 is deposited on the top surface and the lateral surface of the nickel layer 131.

Preferably, during plasma etching of the seed layer 120 and a part of the patterned dielectric layer 140, plasma etching parameters can be adjusted to control the removed thickness of the patterned dielectric layer 140 to be not greater than 1.5 μm, so that the top surface and the lateral surface of the nickel layer 131 can be visible and the patterned dielectric layer 140 after plasma etching has an appropriate thickness for the semiconductor devices.

Figure 10:
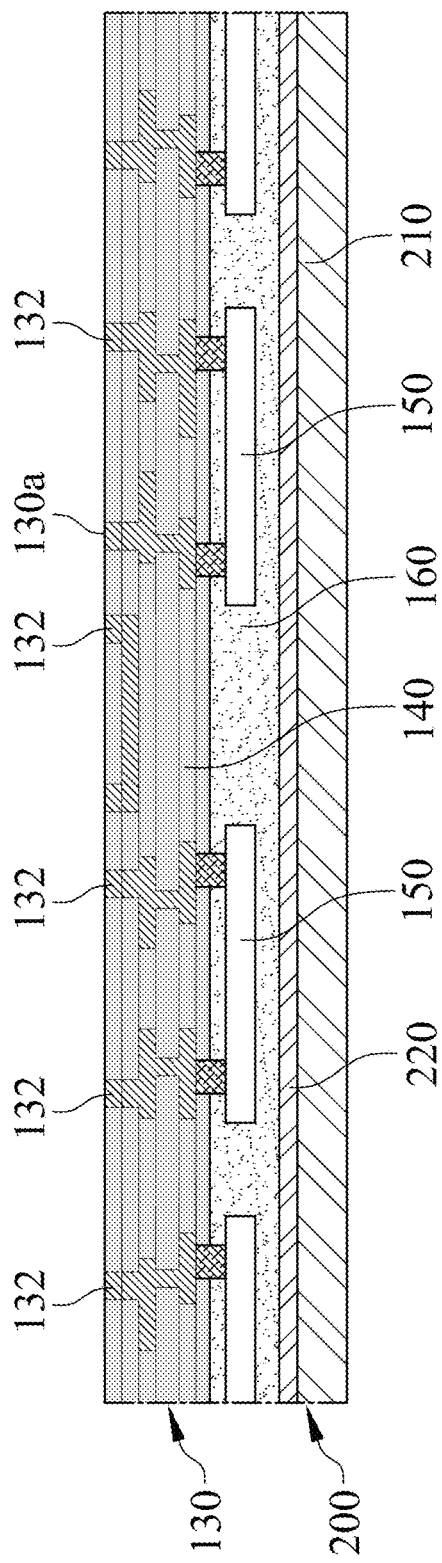
FIGS. 10 and 11 are cross-section view diagrams illustrating a method of manufacturing a semiconductor device in accordance with a third embodiment of the present invention.
Figure 11:
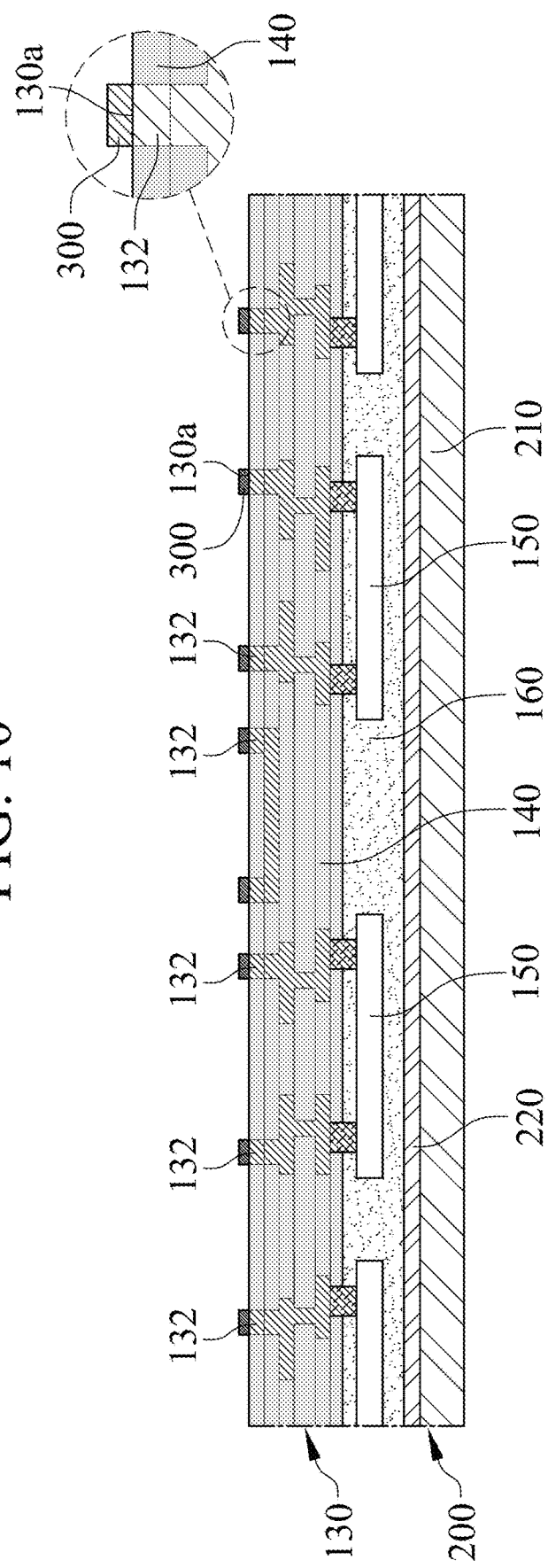

FIGS. 10 and 11 are provided to show a third embodiment of the present invention. Different to the first embodiment, each of the wires 130 of the third embodiment includes a copper layer 132, but not include a nickel layer. The copper layer 132 is a redistribution layer disposed on the seed layer 120. After removing the seed layer 120, the copper layer 132 is exposed, and the gold layer 300 is deposited on the copper layer 132 by immersion gold plating.

Figure 12:
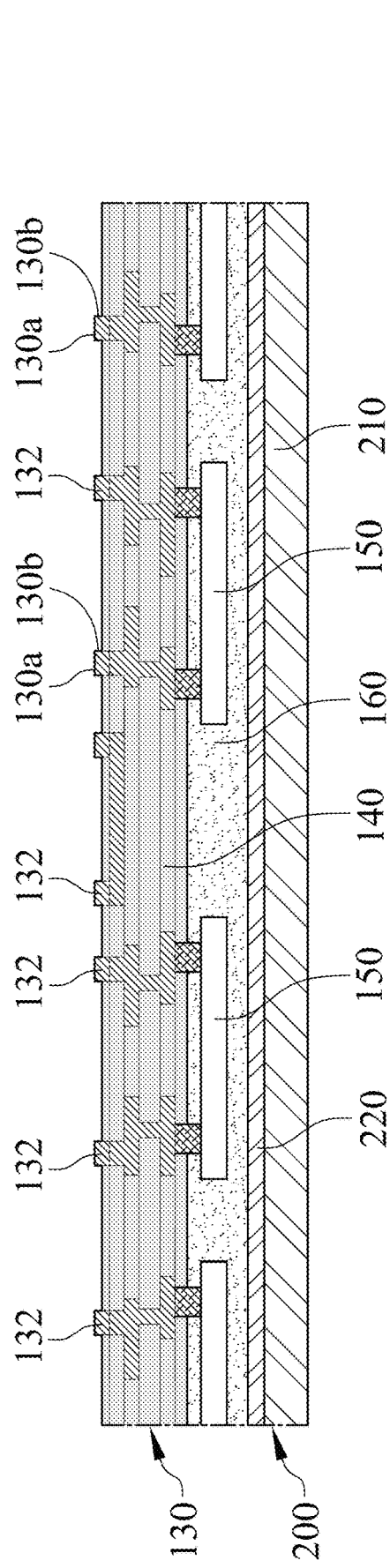
FIGS. 12 and 13 are cross-section view diagrams illustrating a method of manufacturing a semiconductor device in accordance with a fourth embodiment of the present invention.
Figure 13:
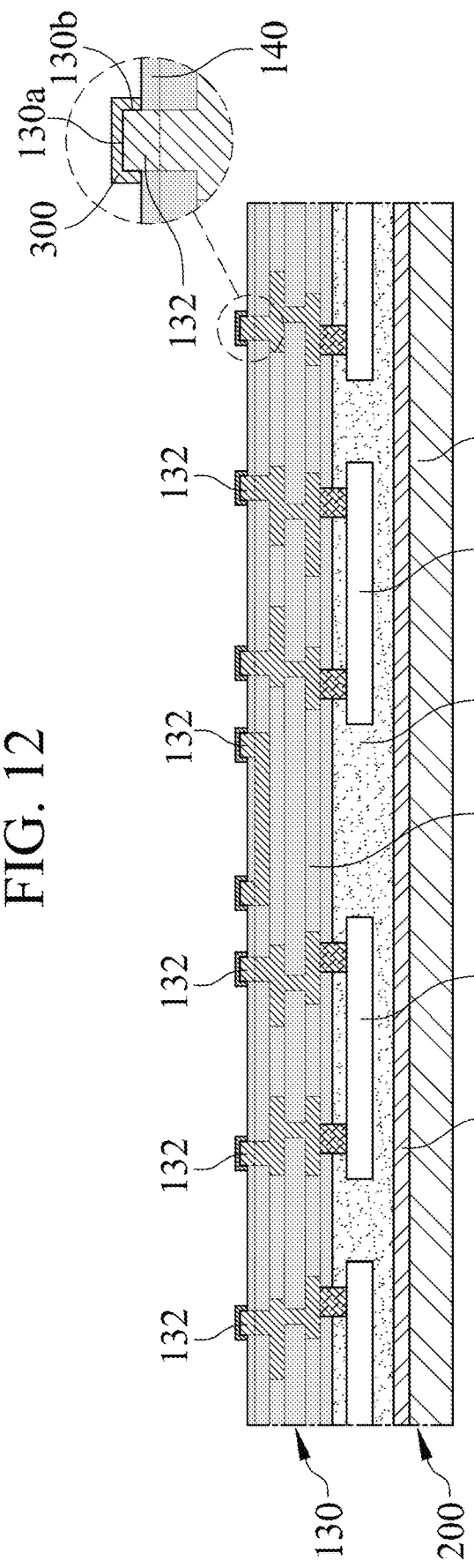

In a fourth embodiment of the present invention as shown in FIGS. 12 and 13, the seed layer 120 and a top part of the patterned dielectric layer 140 are removed by plasma etching, and the exposed top surface 130*a* and the exposed lateral surface 130*b* of each of the wires 130 are the top surface and the lateral surface of the copper layer 132, respectively. Then, the gold layer 300 of the fourth embodiment is deposited on the top surface and the lateral surface of the copper layer 132.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A method of manufacturing semiconductor device comprising the steps of:
   providing a package including a first carrier, a seed layer, a plurality of wires, a die and a molding material, the seed layer is formed on the first carrier, the plurality of wires are formed on the seed layer, the die is bonded to the plurality of wires, and the die and the plurality of wires are covered by the molding material;
   disposing a second carrier on the molding material;
   removing the first carrier to expose the seed layer;
   removing the seed layer to expose the plurality of wires; and
   depositing a gold layer on each of the plurality of wires by immersion gold plating.

2. The method of manufacturing semiconductor device in accordance with claim 1, wherein each of the plurality of wires includes a nickel layer and a copper layer, the nickel layer is formed on the seed layer by pure nickel electroplating, the copper layer is formed on the nickel layer, the nickel layer is exposed after removing the seed layer, and the gold layer is deposited on the nickel layer by immersion gold plating.

3. The method of manufacturing semiconductor device in accordance with claim 2, wherein the copper layer is a redistribution layer.

4. The method of manufacturing semiconductor device in accordance with claim 1, wherein each of the plurality of wires includes a copper layer which is formed on the seed layer, the copper layer is exposed after removing the seed layer, and the gold layer is deposited on the copper layer by immersion gold plating.

5. The method of manufacturing semiconductor device in accordance with claim 4, wherein the copper layer is a redistribution layer.

6. The method of manufacturing semiconductor device in accordance with claim 1, wherein the seed layer is removed by plasma etching.

7. The method of manufacturing semiconductor device in accordance with claim 1, wherein the plurality of wires are formed on the seed layer using a patterned dielectric layer, and a top surface and a lateral surface of each of the plurality of wires are exposed after removing the seed layer and a top part of the patterned dielectric layer by plasma etching.

8. The method of manufacturing semiconductor device in accordance with claim 7, wherein the gold layer is deposited on the top surface and the lateral surface of each of the plurality of wires.

9. The method of manufacturing semiconductor device in accordance with claim 7, wherein a removed thickness of the patterned dielectric layer is less than or equal to 1.5 µm.

10. The method of manufacturing semiconductor device in accordance with claim 1, wherein the plurality of wires are formed on the seed layer using a patterned dielectric layer, each of the plurality of wires includes a nickel layer and a copper layer, the nickel layer is formed on the seed layer by pure nickel electroplating, the copper layer is formed on the nickel layer, a top surface and a lateral surface of the nickel layer are exposed after removing the seed layer and a top part of the pattern dielectric layer by plasma etching.

11. The method of manufacturing semiconductor device in accordance with claim 10, wherein the gold layer is deposited on the top surface and the lateral surface of the nickel layer.

12. The method of manufacturing semiconductor device in accordance with claim 10, wherein a removed thickness of the patterned dielectric layer is less than or equal to 1.5 µm.

13. The method of manufacturing semiconductor device in accordance with claim 1, wherein the plurality of wires are formed on the seed layer using a patterned dielectric layer, each of the plurality of wires includes a copper layer which is formed on the seed layer, a top surface and a lateral surface of the copper layer are exposed after removing the seed layer and a top part of the patterned dielectric layer by plasma etching.

14. The method of manufacturing semiconductor device in accordance with claim 13, wherein the gold layer is deposited on the top surface and the lateral surface of the copper layer.

15. The method of manufacturing semiconductor device in accordance with claim 13, wherein a removed thickness of the patterned dielectric layer is less than or equal to 1.5 µm.

16. The method of manufacturing semiconductor device in accordance with claim 1, wherein the first carrier includes a substrate and a release layer which is located on the substrate, the seed layer is formed on the release layer and exposed after removing the substrate and the release layer.

17. The method of manufacturing semiconductor device in accordance with claim 1, wherein the seed layer is a titanium-tungsten/copper layer or a titanium/copper layer.

18. The method of manufacturing semiconductor device in accordance with claim 1, wherein a solder ball is formed on the gold layer after depositing the gold layer.

* * * * *